United States Patent
Laermer et al.

(10) Patent No.: US 6,720,268 B1
(45) Date of Patent: Apr. 13, 2004

(54) METHOD FOR ANISOTROPIC PLASMA ETCHING OF SEMICONDUCTORS

(75) Inventors: Franz Laermer, Stuttgart (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/720,758

(22) PCT Filed: Apr. 26, 2000

(86) PCT No.: PCT/DE00/01296
§ 371 (c)(1),
(2), (4) Date: Dec. 28, 2000

(87) PCT Pub. No.: WO00/67306
PCT Pub. Date: Nov. 9, 2000

(30) Foreign Application Priority Data

Apr. 30, 1999 (DE) .......................................... 199 19 832

(51) Int. Cl.$^7$ ............................................. H01L 21/311
(52) U.S. Cl. ...................... 438/700; 438/707; 438/714; 438/719
(58) Field of Search ................................. 438/700, 706, 438/707, 714, 715, 719, 734; 216/59–62

(56) References Cited

U.S. PATENT DOCUMENTS

| | | | | |
|---|---|---|---|---|
| 4,795,529 A | * | 1/1989 | Kawasaki et al. ........... 156/643 |
| 5,458,732 A | | 10/1995 | Butler et al. .................... 216/61 |
| 5,498,312 A | * | 3/1996 | Laermer et al. ............... 216/67 |
| 5,501,893 A | * | 3/1996 | Laermer et al. ............. 428/161 |
| 5,605,600 A | * | 2/1997 | Muller et al. .................. 216/67 |
| 5,770,097 A | | 6/1998 | O'Neill et al. ................. 216/60 |
| 5,983,828 A | * | 11/1999 | Savas .......................... 438/714 |
| 6,051,503 A | * | 4/2000 | Bhardwaj et al. ........... 438/705 |
| 6,187,685 B1 | * | 2/2001 | Hopkens et al. ............. 438/710 |
| 6,200,822 B1 | * | 3/2001 | Becker et al. .................. 438/9 |
| 6,258,287 B1 | * | 7/2001 | Martin et al. .................. 216/71 |

FOREIGN PATENT DOCUMENTS

| | | |
|---|---|---|
| DE | 42 41 045 | 5/1994 |
| DE | 197 30 644 | 11/1998 |
| DE | 198 41 964 | 3/2000 |
| EP | 0 383 570 | 8/1990 |
| EP | 0 822 582 | 2/1998 |

* cited by examiner

Primary Examiner—Nadine G. Norton
Assistant Examiner—Duy-Vu Deo
(74) Attorney, Agent, or Firm—Kenyon & Kenyon

(57) ABSTRACT

A method of anisotropic etching of structures in a semiconductor body, in particular of recesses in a silicon body (18) exactly defined laterally by an etching mask, by using a plasma (28) is proposed. An ion acceleration voltage induced in particular by a high-frequency AC voltage is applied to the semiconductor body at least during an etching step having a predefined duration. The duration of the etching step is further subdivided into at least two etching segments between which the ion acceleration voltage applied is modified each time. Preferably two etching segments are provided, a higher acceleration voltage being used during the first etching segment than during the second etching step. The length of the first etching segment can furthermore be determined dynamically or statically during the etching steps using a device for the detection of a polymer breakdown. In order to generate and adjust the value of the acceleration voltage, preferably high-frequency pulses or pulse packets having an adjustable pulse/pause ratio are used.

20 Claims, 1 Drawing Sheet

METHOD FOR ANISOTROPIC PLASMA ETCHING OF SEMICONDUCTORS

FIELD OF THE INVENTION

The present invention relates to a method of anisotropic etching of structures in a semiconductor body, in particular of recesses in a silicon body exactly defined laterally by an etching mask, by using a plasma according to the definition of the species of the main claim.

BACKGROUND OF THE INVENTION

German Patent 42 41 045 C1 describes a method of anisotropic plasma etching of silicon. In this method passivation and etching steps are alternated with polymer material being deposited on the structures exposed by etching during the passivation steps and fluorine radicals, which etch silicon anisotropically per se, being released from a fluorine-delivering agent in the plasma during the etching steps. At the beginning of each etching step, breakdown of the etching base produced in the previous passivation step is first completed by a controlled ion bombardment of the etching base of the etched structures during the etching steps.

During the essentially isotropic etching steps, local anisotropy is achieved by the fact that the portion of obliquely incident ions hitting the side wall of the structures effect forward sputtering during etching, i.e., stripping and redeposition of the side wall polymer film toward the deeper parts of the trench produced, so that the side walls always remain passivated by a protective film as etching continues and are protected against the etching attack of the isotropically acting fluorine chemicals.

For this purpose the ion energy needed during the etching steps, which is produced via an acceleration voltage generated by injecting high-frequency power and applied to the substrate electrode, i.e., the silicon wafer to be etched, must be sufficient to ensure breakdown of the etching base passivation at the beginning of each etching step, while keeping the etching base free of polymer during the etching step and maintaining the side wall polymer film transport mechanism. This is achieved in German Patent 42 41 045 C1 through a relatively low ion energy of 10 to 15 eV which is applied for the entire duration of the etching steps.

Due to the constant ion acceleration, constant selectivity is obtained between side wall film stripping and the etching base polymer stripping, the duration of each etching step being limited by the fact that most of the side wall polymer film has been stripped away, i.e., forward sputtered, during the etching steps. Therefore it must be periodically reinstalled using a new passivation step, which ultimately also limits the etching rates that can be achieved, because the passivation pauses represent an interruption of the etching process. If the process is run with too little passivation, anisotropy of the etching suffers and lateral pockets are formed by a phenomenon known as "notching" in the area of the dielectric boundary surfaces, i.e., for example, at the etching stop layer when silicon etching is stopped.

In unpublished German Patent Application 198 41 964.3 it is proposed that a plasma etching system be provided with a device for cooling a silicon body during an anisotropic etching process. Finally, it is known from German Patent Application 197 30 644.9 that the concentration of fluorine atoms or fluorine ions can be determined in a plasma using an optical emission spectrometer and a downstream analyzer.

SUMMARY OF THE INVENTION

The method according to the present invention having the characterizing features of the main claim has the advantage over the related art that it allows adjustment of the intensity of the effective ion acceleration between plasma and substrate electrode to the physical-chemical processes during the etching steps and, when needed, also during the polymerization steps, so that the side wall polymer film can withstand the etching step for a longer period. This results in that longer etching times can be used in the etching steps and interruptions by passivation steps become less frequent, i.e., they are only required at longer time intervals. Therefore, a higher overall etching rate is advantageously achieved.

Advantageous refinements of the present invention are derived from the measures named in the subclaims.

Thus, the mask selectivity is advantageously improved by the fact that etching is performed using a high ion acceleration voltage only in the initial etching base polymer breakdown phases, while during the remaining duration of the etching steps only the etching base of the polymer material is kept free and the side wall film transport mechanism is preserved through reduced ion acceleration produced by reduced voltage.

Finally, anisotropy of the etching process, in particular with regard to the vertical profile achieved, is also improved, because side wall passivation is more effective and the process parameters can be optimized so that always the exactly correct amount of polymer is stripped and redeposited, i.e., forward sputtering is achieved through ion bombardment induced by the voltage applied.

It is furthermore advantageous that due to a temporarily reduced high-frequency AC voltage or injected high-frequency power, which is associated with a reduced ion acceleration voltage, during the etching steps the side wall polymer will be stripped more slowly, so that better selectivity of the etching base polymer stripping relative to the side wall polymer stripping is achieved over an etching step. As a result, the etching steps can be very advantageously extended in time which improves both the etching rate and at the same time also etching anisotropy. This is explained by the fact that in the etching steps exactly as much polymer is forward sputtered as is needed for achieving an optimum etching profile (vertical walls). At the same time, with reduced ion acceleration also less mask material is stripped, also advantageously achieving higher mask selectivity.

Finally, the method according to the present invention is also "softer" overall, i.e., less corrosive on reaching a dielectric boundary surface, because the ion energy is reduced each time after the breakdown of the etching base passivation. Harmful effects of the ion bombardment are thus reduced, in particular the "notching effect" with formation of pockets as a result of electrical charges and ion deflection in the boundary surface areas over the remaining time of the etching step.

It is furthermore advantageous that the duration of the etching segments can be dynamically controlled, via an optical emission spectrometer which determines the fluorine concentration in the plasma as a function of time, and regulated via the high-frequency generator.

The method according to the present invention furthermore allows to advantageously vary the injected high-frequency power continuously with a ramp function between the etching segments and on transition from etching steps to polymerization steps.

Furthermore, it is advantageous that the method according to the present invention can be combined with a plurality of additional process parameters and optimized to the respective requirements. The process pressure, the gas flow rate of the reactive gases supplied, and the plasma power, for example, are particularly suitable for this purpose.

It is also particularly advantageous if the variation over time of the ion acceleration voltage is combined with an adjustment of the temperature of the silicon body to be etched. This allows almost simultaneous breakdown of the etching base polymer to be achieved regardless of the aspect ratio of the respective trenches.

In order to modify the ion acceleration voltage, a plurality of options are advantageously available. The preferred method includes modulation of the injected high-frequency power with a low-frequency modulation voltage during the etching segments or dividing the high-frequency power or high-frequency AC voltage applied into AC voltage pulses with a defined adjustable pulse/pause ratio, which in a particularly advantageous embodiment is considerably smaller than 1. Thus electrical charges capable of causing "notching" effects can be reduced.

The ion acceleration voltage is obtained in this case in the form of very short, very intensive high-frequency pulses with relatively long pauses between the pulses, the average value of the ion acceleration being adjustable directly via the pulse/pause ratio in a broad range.

In order to accelerate the initial etching base polymer breakdown at the beginning of an etching step, it is furthermore advantageous if a gas that is chemically corrosive particularly toward the etching base polymer such as $NF_3$ or $O_2$ is added during this time.

BRIEF DESCRIPTION OF THE DRAWINGS

The present invention is described in detail in the description that follows with reference to the drawing.

DETAILED DESCRIPTION OF THE INVENTION

Figure 1:
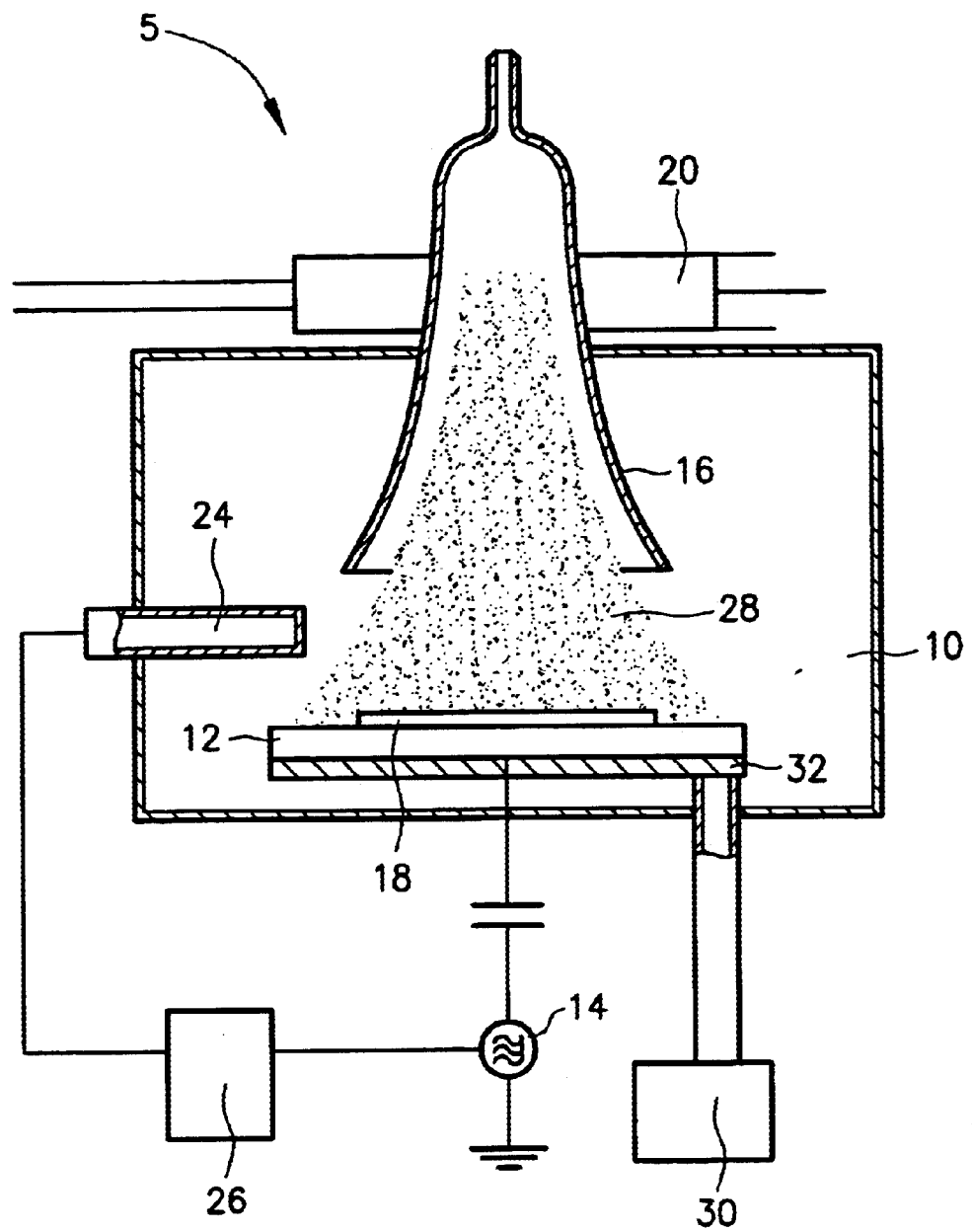
FIG. 1 shows a plasma system.

The figure shows a plasma etching system 5 having an etching chamber 10 in which a substrate electrode 12 is arranged; substrate electrode 12 is in contact with a silicon body 18 to be etched, in particular a silicon wafer structured using an etching mask. A high-frequency generator 14 which generates a high-frequency power injected into silicon body 18 via substrate electrode 12 is also provided. Thus a high-frequency AC voltage is applied to silicon body 18 via the injected high-frequency power. As an ion acceleration voltage, this AC voltage causes positively charged ions generated in a plasma 28 to accelerate and to impinge at least largely almost perpendicularly on the surface of silicon body 18. A Surfatron 16 and a waveguide 20 are also provided. Waveguide 20 is used for radiating or injecting electrical fields onto Surfatron 16 to generate plasma 28, in particular high-frequency electrical fields or preferably electrical microwave fields. Reactive gases are supplied from above in a known manner to Surfatron 16.

An optical emission spectrometer 24, connected to an analyzer 26, is provided for analyzing the composition of plasma 28 as a function of time using the emission lines typical for the plasma composition. Analyzer 26 is further connected to a setpoint input of high-frequency generator 14 so that the high-frequency AC voltage injected by high-frequency generator 14 into silicon body 18, which causes ion bombardment from plasma 28 is controlled via analyzer 26 as a function of the plasma composition determined via the optical emission spectrometer. A cooling unit 30, which is connected to a substrate electrode cooler 32 and can be set in the range of −30° C. to +70° C. for adjusting the temperature of substrate electrode 12 and thus of silicon body 18, is also provided. The high-frequency power or high-frequency AC voltage injected into the substrate electrode by high-frequency generator 14 can be a high-frequency power whose amplitude remains constant over time during an etching step or a high-frequency AC voltage; in a preferred embodiment however, it can also be a clocked high-frequency power or high-frequency AC voltage having a variably adjustable pulse/pause ratio between the etching steps and/or during an etching step, the pulses being particularly preferably selected to be very short and intensive with relatively long pauses between the pulses.

Plasma etching system 5 and an anisotropic plasma etching method that can be performed with it are essentially known from German Patent 42 41 045 C1, except for emission spectrometer 24, analyzer 26 and the high frequency AC voltage or high-frequency power controlled by them and applied to silicon body 18, and substrate electrode cooler 32.

A plasma etching system having a device for cooling a silicon body during anisotropic etching processes was proposed in unpublished German Patent Application 198 41 964.3. This application provides further details regarding the technical implementation of substrate electrode cooler 32 and cooling unit 30.

The essence of the present invention is controlled modulation of the ion acceleration voltage effectively applied to silicon body 18 over the duration of the etching steps.

For this purpose, each etching step is divided into at least two etching segments with a different high-frequency AC voltage or high-frequency power and thus a different effective ion acceleration of the electrically charged particles from plasma 28 to silicon body 18 being used in each individual etching segment compared to the previous etching segment.

The different ion acceleration voltages applied to silicon body 18 are preferably generated, at least from time to time, via corresponding different injected high-frequency powers of high-frequency generator 14 for this purpose.

In particular, as a first embodiment, a high-frequency power or a high-frequency AC voltage is initially applied to silicon body 18 via substrate electrode 12 at the beginning of each etching step using high-frequency generator 14; this high-frequency power or high-frequency AC voltage is sufficient for a quick breakdown of an etching base polymer produced during a previous passivation or polymerization step, for example, in trenches that have already been etched. After the breakdown of the etching base polymer in this first etching segment, the high-frequency power, for example, is then reduced until recovering of the etching base with polymer material is prevented, but the high-frequency power is still sufficient for maintaining the known side wall polymer film transport, which in turn is required for preserving local anisotropy of the plasma etching method in the etching steps.

Based on an anisotropic plasma etching method for silicon as known, for example, from German Patent Application 42 41 045 C1 a set of parameters suitable for the method according to the present invention is given by the following settings for the gases used, gas flow rates, plasma lines, plasma powers, durations of the individual process steps, and the intensity of the injected high-frequency power or the high-frequency AC voltage applied:

Passivation or polymerization step:
  100 sccm $C_4F_8$ at 10 μbar pressure, 800 W plasma power, 5 seconds duration of the passivation step, no high-frequency power at silicon body 18 or substrate electrode 12.

Etching step:
    Total duration of an etching step: 20 seconds
    First segment of the etching step:
        130 sccm $SF_6$+20 sccm $O_2$ at 20 μbar pressure, 800 W plasma power, high-frequency power of 10 W or amplitude of the high-frequency AC voltage (13.56 MHz) of 30 V to 50 V, duration of the first etching segment: 2 seconds (breakdown phase of the etching base polymer).
    Second segment of the etching step:
        130 sccm $SF_6$+20 sccm $O_2$ at 20 μbar pressure, 800 W plasma power, high-frequency power of 4 W or amplitude of the high-frequency AC voltage (13.56 MHz) of 10 V to 20 V, duration of the second etching segment: 18 seconds (holding the etching base free of polymer material and driving forward of the side wall polymer film).

The above-mentioned set of parameters is understood to be an example only. Appropriate values for the amplitude of the high-frequency AC voltage and of the effective ion acceleration voltage defined by these in the above example are normally between 1 V and 100 V at a frequency of 1 MHz to 50 MHz.

In this first embodiment, the amplitude of the high-frequency power is initially not varied within an etching segment, i.e., high-frequency generator 14 is operated continuously at a constant high-frequency power during the etching segments and therefore injects a high-frequency AC voltage that has a constant amplitude over time during the etching segments into substrate electrode 12.

The division of the etching step into first short phase of 2 seconds with a relatively high voltage amplitude at substrate electrode 12 or silicon body 18 and a second, long, phase of 18 seconds with a relatively low voltage amplitude results from the observation that after approximately 2 seconds and under the given conditions complete breakdown of the etching base polymer has occurred, and thereafter only the side wall film transport and the suppression of redeposition on the etching base must be maintained with a reduced effective ion acceleration voltage between plasma 28 and substrate electrode 12.

One advantageous refinement of the above-mentioned first embodiment results from the fact that plasma etching system 5 also has a device with which the time of breakdown of the etching base polymer can be exactly detected using measurement technology via physical measured values, so that the duration of the individual etching segments can be detected and dynamically controlled with this device during the respective etching step.

Optical emission spectrometer 24 is well suited for plasma diagnosis as such a device, for example. For this purpose, it is set to a fluorine emission line, for example, to 687 nm or 704 nm so that the intensity of the fluorine emission in plasma 28 indirectly indicates the fluorine-consuming open silicon surface available. The higher the open silicon surface as a function of time, the lower the measured fluorine intensity, because a large amount of fluorine is consumed in etching reactions from plasma 28 during this period. The lower the open silicon surface, the higher the fluorine intensity. As long as the silicon etching base of the etched structures of silicon body 18 is covered with polymer, the open silicon surface is virtually zero. In the case of the breakdown of the etching base polymer, however, more or less the entire silicon surface that has been etched free becomes a fluorine consumer.

Regarding further, essentially known, details of determining fluorine concentration using optical emission spectrometer 24 and downstream analyzer 26 in plasma 28 or for detecting the exact point in time of the breakdown of the etching base polymer, reference is made to German Patent Application 197 30 644.9.

In the above-described example, the duration of the first etching segment or the breakdown of the etching base polymer can thus be determined using optical emission spectrometer 24 once for the respective process and then fixedly programmed into analyzer 26 so that the latter then sets the high-frequency power of high-frequency generator 14 accordingly at the appropriate times and thus the high-frequency AC voltage or effective ion acceleration voltage assigned to the respective etching segment is set at silicon body 18. As an alternative and preferably, however, dynamic control is provided with the variation of the intensity of fluorine emission being detected from the signal of optical emission spectrometer 24 and preferably continuously assigned to an etching segment by analyzer 26. Thus analyzer 26, working together with high-frequency generator 14 and optical emission spectrometer 24, regulates the injected high-frequency power or the high-frequency AC voltage assigned to the respective detected etching segment at the predefined setpoint values.

Thus a set of parameters can be determined in a simple manner for the duration of the individual, preferably two, etching segments during an etching step; these parameters may dynamically differ from the set of parameters defined as an example during an etching step or an etching segment. Therefore preliminary tests for determining the optimum time for reducing the high-frequency power or the effective ion acceleration voltage during an etching step are no longer required.

As an alternative to optical emission spectroscopy for detecting the etching base polymer breakdown, i.e., the time of transition between two etching segments, laser interferometry or reflectometry can also be used both in the case of dynamic determination with downstream closed-loop control and static determination with downstream open-loop control. Both methods are generally known in the related art as endpoint detection systems.

Using the above-named devices for detecting the etching base polymer breakdown it is furthermore possible to easily detect whether the high-frequency power or the high-frequency AC voltage applied to substrate electrode 12 used in a second etching segment after breakdown is always sufficient during the second etching segment for keeping the etching base of the etched structure free of polymer material. If this voltage is occasionally insufficient for this purpose, this fact is immediately manifested in redeposition of polymer material on the etching base resulting in a modified signal in optical emission spectrometer 24 which, in the case of dynamic closed-loop control via processing unit 26, is immediately compensated by increasing the AC voltage applied to silicon body 18 via high-frequency generator 14.

For the intensity of the injected high-frequency power or the amplitude of the high-frequency AC voltage in the second etching segment after the breakdown of the etching base polymer, the general rule is: as little as possible, as much as necessary. Excessively low voltage results in unsatisfactory anisotropy, while an excessively high voltage results in loss of mask selectivity, etching rate, and anisotropy, promoting increased pocket formation.

It should also be emphasized that the high-frequency power or the high-frequency AC voltage applied to silicon body 18 should not be switched back suddenly but rather via a ramp function over time, for example, over a period of 0.5 seconds to 4 seconds. In doing so, the high-frequency voltage is reduced over a period of 2 seconds, for example, after the first etching segment, after which it then reaches the setpoint value of the second etching segment and is held at this value.

In a second embodiment of the present invention, in a refinement of the first embodiment, relatively high plasma powers, for example, of 1500 W instead of 800 W are used in the passivation or polymerizations steps, the process pressure preferably being in the optimum range for passivation, i.e., 10 μbar to 20 μbar and the gas flow rate being 100 sccm to 200 sccm.

In this way it is achieved that in the passivation steps a particularly resistant, relatively thick side wall polymer is deposited which in the subsequent etching step remains particularly stable because of its improved chemical resistance due to its increased density.

In this embodiment additional ion acceleration is also used via high-frequency generator 14 even during the passivation steps by applying a high-frequency voltage of 5 V to 20 V, for example, or a high-frequency power of 2 W to 5 W to cause the deposited side wall polymer material to be transported into the depth of the trenches produced earlier during the passivation steps. Thus even the deeper portions of the trenches are effectively covered with a side wall protective film, while the side wall film obtained is thinner in the upper areas of the trenches than without ion acceleration, and the thickness of the side wall film increases in the lower part of the trench.

Depending on whether the priority in the above-described embodiment is suppression of the "notching effect," i.e. of the undesirable underetching, or profile deviation at the dielectric boundary surfaces in silicon body 18 to be etched, or achieving the highest possible etching rates in the etching process, the etching steps continue differently.

If the priority is the avoidance of "notching effects" at dielectric boundary surfaces, the subsequent etching step is performed under relatively mild conditions, i.e., the plasma power remains at a relatively low value of 800 W, for example, or is even reduced to 600 W, for example. Thus the overall plasma density in plasma 28 is kept low, and the etching step is less corrosive. In order to further minimize the electrical charging effects, the process pressure in the etching step is preferably increased at the same time to 25 μbar to 40 μbar.

After a short, very intensive first etching segment of the etching step, like the first embodiment, with the breakdown of the now very resistant etching base polymer, the system switches over into a milder second etching segment also according to the first embodiment, where "notching," i.e., profile deviations are prevented by a very effective passivation of the structure side wall due to the now resistant side wall polymer.

In the second etching segment, the process pressure of reactive gases in plasma etching system 5 is preferably increased to 25 μbar to 40 μbar, for example, after the breakdown of the etching base polymer and thus the ion density, the ion flow rate, and the charging effects are permanently reduced in the second etching segment.

In contrast, if the priority is achieving the highest possible etching rates, the highest possible power is used in the etching cycles in order to achieve the highest possible density of silicon-etching fluorine radicals. For this purpose, the plasma power is increased over the power in the passivation step to values from 3000 W to 5000 W in the etching step, with the density of free fluorine radicals being further increased using the highest possible process pressure, for example, of 40 μbar to 100 μbar. This high process pressure causes the ion density to the reduced in the etching step, which reduces harmful charging effects by reducing the ion flow rate to silicon body 18 thus improving profile control.

Overall, also in this method version, the etching base is freed from previously deposited polymer material in a short, corrosive first etching segment of the etching step, initially as in the first embodiment, while the following etching segment includes the above-described process control under milder conditions for the side wall polymer material. Due to the deposition of a particularly strong side wall polymer material during the passivation step, this material resists the fluorine-rich etching step particularly well, so that correspondingly deep etching at a high rate becomes possible.

In a third embodiment of the present invention, in a refinement of the first or second embodiment, breakdown of the etching base polymer also takes place at approximately the same time in all trenches regardless of their width or depth to width ratio (aspect ratio) by controlled adjustment of the temperature of silicon body 18.

In general, the polymer stripping rate in narrow trenches is slower than in wide trenches, because with increasing aspect ratio (depth to width ratio) a smaller and smaller portion of the ions impinging from plasma 28 reach the etching base. This effect results, among other things, in a general reduction in the etching rate in narrow trenches compared to wide trenches, which is referred to as the "RIE law." On the other hand, the transport of species, for example, polymer-forming monomers, into the depth of the trenches is also increasingly difficult with increasing aspect ratio, i.e. less and less polymer-forming monomers reach the etching base, with the ultimate effect that the narrow trenches are coated with a thinner etching base polymer compared to wide trenches.

Therefore, in the above-described example, ion-induced stripping of the etching base polymer is also adjusted by varying the substrate temperature in the range of −30° C. to +70° C. so that approximately the same etching rates are achieved for all etched structures in silicon body 18, largely independently of their aspect ratio. Thus, by setting the temperature of silicon body 18 via substrate electrode 12 and substrate electrode cooler 32, for example an approximately simultaneous breakdown of the etching base polymer is achieved in the first etching segment of each etching step for all structure widths.

The favorable temperature setting is preferably determined for this purpose in a few preliminary tests using test etchings on silicon bodies structured, for example, like silicon bodies 18 to be processed later in operating etching system 5, using above-described optical emission spectrometer 24 or via a reflectometer. This is accomplished by optimizing the breakdown of the etching base polymer in silicon bodies 18 in the preliminary tests via optical emission spectrometer 24 using a variation of the temperature of the silicon body, for example, for the steepest possible drop in the fluorine signal or for the steepest possible increase in the silicon tetrafluoride signal.

The smaller the differences of the required breakdown time of the etching base polymer between trenches of different widths or etched structures on silicon body 18 having different aspect ratios, the more steeply the fluorine signal drops in optical emission spectrometer 24. Thus an optimization strategy is defined via the variation of the temperature of silicon body 18 through substrate electrode cooler 32 and maximization of the drop in the fluorine signal in order to achieve as closely a simultaneous breakdown of the etching base polymer in different structures as possible.

Temperatures of −10° C. to +30° C., preferably +10° C. have proven to be particularly favorable.

In the fourth, particularly advantageous, embodiment of the present invention, the high-frequency power or high-frequency AC voltage of high-frequency generator 14 is switched back after the breakdown of the etching base polymer, i.e., at the beginning and during the second etching segment in the etching steps as described in the first embodiment, by modulating the high-frequency AC voltage or injected high-frequency power generated by high-frequency generator 14 and applied to silicon body 18 using an additional low-frequency modulation voltage signal so that the "envelope curve" of the high-frequency AC voltage, i.e., the line connecting the AC voltage amplitudes, is defined by the instantaneous value of the low-frequency modulation voltage. The low-frequency modulation signal from an additional essentially known low-frequency generator provided is supplied for this purpose to an input of high-frequency generator 14 provided for amplitude modulation. Many commercially available high-frequency generators are equipped with such a modulation input, so that this function can be advantageously used as described in the context of the present invention.

Such an amplitude modulation (AM) which is also correspondingly transferred to the effective ion acceleration voltage between substrate electrode 12 and plasma 28, is essentially known to those skilled in the art of high-frequency technology. In the simplest case, this amplitude-modulated high-frequency signal is obtained by multiplying the high-frequency AC voltage used as the carrier voltage by the low-frequency modulation signal. The high-frequency AC voltage has for this purpose, as explained above, a frequency of 1 MHz to 50 MHz, for example, while the low-frequency modulation voltage has a preferred frequency of 50 Hz to 1 MHz, particularly preferably of 200 Hz to 10 kHz.

The curve of the low-frequency modulation voltage over time has a shape that is rectangular or rectangular pulse, triangular, at least in some segments, or, preferably, sinusoidal, at least in some segments.

A rectangular or rectangular pulse shape of the low-frequency modulation voltage curve corresponds, after multiplication with the high-frequency AC voltage, to periodic switching on and off of the high-frequency power generated by high-frequency generator 14 at the frequency of the modulation voltage. As an alternative, many commercially available high-frequency generators have a special input provided for modulation with a rectangular low-frequency signal, known as a "burst" input; as long as a voltage higher than a threshold value, for example, of 1 V, is applied to this "burst" input, a high-frequency AC voltage or high-frequency power of the desired predefined setpoint value is generated correspondingly by high-frequency generator 14. For a voltage lower than this threshold voltage, for example, for 0 V, no high-frequency AC voltage or high-frequency power is generated by high-frequency generator 14. This control of high-frequency generator 14 corresponds to a periodical switching on and off of high-frequency generator 14 at the frequency of the low-frequency modulation voltage.

The advantage of a burst input compared to the conventional on/off procedures is the particularly quick and reproducible switching.

In particular, in the above-described embodiment, a high-frequency AC voltage having a constant amplitude, i.e., without additional modulation, is first applied to silicon body 18 via high-frequency generator 14 during a first etching segment of an etching step, i.e., until the breakdown of the etching base polymer. After the breakdown of the etching base polymer, which is determined in a manner similar to that of the previous embodiment, for example, using optical emission spectrometer 24, thus dynamically determining the duration of the first etching segment, the procedure continues with reduced effective ion acceleration in a second etching segment.

For this purpose, in this second etching segment high-frequency oscillation packets or high-frequency pulses having a rectangular, rectangular pulse, or, in some segments, approximately sinusoidal envelope are sent to substrate electrode 12, i.e., silicon body 18, periodically at time intervals via a suitable additionally generated low-frequency modulation voltage with which the actual high-frequency AC voltage is modulated in a manner known per se.

In the simplest case, the envelope of the high-frequency AC voltage pulse has a sinusoidal shape in this second etching segment, so that the effective ion acceleration voltage to which this modulation is transferred is halved compared to the first etching segment.

Reduction in the effective ion acceleration in the second etching segment can also be achieved additionally or as an alternative via a larger time interval between the high-frequency AC voltage pulses or by shortening the duration of the AC voltage pulses. Then the effective ion acceleration voltage to substrate electrode 12 and thus to silicon body 18 to be etched also increases or decreases depending on the respective pulse/pause ratio defined via the interval and duration of the high-frequency AC voltage pulses. Typical pulse/pause ratios are 0.01 to 1. Particularly preferred are pulse/pause ratios between 0.05 and 0.2.

The above-described method of modifying the effective ion acceleration voltage in the second etching segment using an additional adjustable-frequency, relatively low-frequency modulation voltage and a variably adjustable pulse/pause ratio is obviously also suitable for adjusting the effective ion acceleration in the first etching segment, being very advantageous there.

Thus, for example, different ion acceleration voltages can be achieved in the different etching segments or process steps of the etching method according to the present invention also by using a high-frequency AC voltage having a constant amplitude over time or injected high-frequency power of high-frequency generator 14, by modulating this AC voltage or high-frequency power via the additional low-frequency modulation voltage at least from time to time with different frequencies or signal shapes or by this AC voltage or high-frequency power having different pulse/pause ratios. Especially in the case of a rectangular pulse curve, high-frequency generator 14 can be periodically switched on and off ("pulsed") in this manner using its "burst" input with a low-frequency rectangular voltage having a variable pulse/pause ratio. Thus high-frequency pulses are generated having an approximately rectangular envelope and an adjustable pulse/pause ratio which is preferably much smaller than 1 being, in particular, between 0.2 and 0.01.

By using high-frequency AC voltage pulses during the second etching segment in the etching steps, the etching base is thus always exposed again during these pulses, and the side wall polymer film is driven forward in these phases. During the time between two pulses, there is some (re) deposition on the etching base and also some side wall attack due to the lack of a forward sputtering effect on the side wall, i.e., low local anisotropy; however the next high-frequency AC voltage pulse exposes the etching base again, also guaranteeing further forward drive of the side wall film further into the trench.

Since after the first removal of the initial polymer film from the etching base at the beginning of each particular etching step in the first etching segment only occasional redepositions are to be removed from the etching base, such a use of relatively short but intensive AC voltage pulses during the second etching segment is often sufficient.

Controlling the process using low-frequency modulation of the high-frequency AC voltage or high-frequency power and/or using a certain setting of the pulse/pause ratio of the high-frequency AC voltage pulses during the individual etching segments has the additional very considerable advantage compared to the other embodiments that within the pulse pauses, i.e., little or no effective ion acceleration voltage applied to silicon body 18, previously unavoidably induced charges can be discharged.

Particularly preferred for preventing induced charges is the use of intensive, high-frequency pulses that are as short as possible, i.e., short high-frequency pulses having high voltage amplitudes and relatively long pauses between the individual high-frequency pulses. In this case, the etching base, which may be a dielectric for example, is initially only charged to a moderate extent during the short duration of the intensive pulses which accelerate the incident ions to a high ion energy in a short period of time.

This already moderate charge is then further reduced during the relatively long pauses between the individual high-frequency pulses via discharging before the next short high-frequency pulse with similarly high ion acceleration follows. For such a modulation with high-frequency pulses that are as short as possible and with long pauses between the pulses, a low-frequency repeat frequency of 50 Hz to 10 kHz is preferably used.

It is, of course, possible to combine the previously described modulation of high-frequency AC voltage and the variation of the pulse/pause ratio.

In a fifth embodiment, a second, additional high-frequency generator is used, which has a design similar to high-frequency generator 14 and is also connected to substrate electrode 12; in the first etching segment, it is turned to high output upon a signal of high-frequency generator 14. This second additional generator is preferably operated so that it superimposes short high-frequency pulses having a low pulse/pause ratio on the signal of high-frequency generator 14.

Furthermore, it is advantageous in this case if both high-frequency generators operate at different frequencies, for example, at 2 MHz and 13.56 MHz, so that high-frequency generator 14 is operated continuously and the second high-frequency generator is only operated during the "burst phases", which are used, for example, for breaking down the etching base polymer.

By using different frequencies for the two generators, electrical insulation of the generators with respect to each other is achieved in a simple manner through respective differently tuned adaptation networks thus avoiding mutual injection of power by the generators.

The above-described embodiments can also be combined with the addition, at least from time to time, of a gas that is particularly chemically corrosive with respect to the etching base polymer, for example, $O_2$ or preferably $NF_3$, this particularly corrosive gas being used at a flow rate of 2 sccm to 20 sccm, preferably only during the first etching segment to support etching base polymer breakdown that is as fast as possible, and after a breakdown has occurred during the second etching segment it is no longer added to the process gas.

The previously described embodiments explain the method according to the present invention using the example of anisotropic etching of silicon. The method is, however, not limited to silicon, but is also suited, possibly in conjunction with an adjustment of the process parameters and reactive gases as known to those skilled in the art, for other semiconductor materials such as, for example, Ge, GeAs, AlN, and GaP.

Reference Symbol List

| | |
|---|---|
| 5 | plasma etching system |
| 10 | etching chamber |
| 12 | substrate electrode |
| 14 | high-frequency generator |
| 16 | Surfatron |
| 18 | silicon body |
| 20 | resonator |
| 24 | optical emission spectrometer |
| 26 | analyzer |
| 28 | plasma |
| 30 | cooling unit |
| 32 | substrate electrode cooler |

What is claimed is:

1. A method of anisotropic etching of structures in a semiconductor body, including recesses in a silicon body exactly defined laterally by an etching mask, comprising the step of etching the semiconductor body by using a plasma, wherein an ion acceleration voltage is applied to the semiconductor body between the plasma and the semiconductor body at least during an etching step, wherein the etching step is subdivided into at least two etching segments between which the ion acceleration voltage applied is modified each time, and wherein the ion acceleration voltage applied is generated by a high-frequency AC voltage applied to the substrate electrode which has an amplitude greater than 30 V but not greater than 200 V and a frequency of 1 MHz to 50 MHz;

wherein at least the length of the first etching segment during an etching step is determined using a device for detecting an etching base polymer breakdown, and wherein an optical emission spectrometer, a laser interferometer, or a reflectometer is used as the device for detecting the etching base polymer breakdown, the device continuously or randomly detecting one of the measured physical quantities characterizing the etching base polymer breakdown.

2. The method according to claim 1, wherein the semiconductor body is a structured silicon wafer which is connected to a substrate electrode.

3. The method according to claim 1, wherein the high-frequency AC voltage has an amplitude of from greater than 30 V but not greater than 70 V and is generated using at least one high-frequency generator, which injects a high-frequency power into the semiconductor body, and wherein the injected high-frequency power is modified according to the high-frequency AC voltage modified during the etching steps.

4. The method according to claim 1, wherein the etching step is subdivided into a first and a second time segment, and wherein a higher high-frequency AC voltage or a higher high-frequency power is used during the first etching segment than during the second etching segment.

5. The method according to claim 4, wherein a high-frequency AC voltage having an amplitude of greater than 30 V but not greater than 70 V is used during the first etching segment and a high-frequency AC voltage having an amplitude of 10 V to 20 V is used during the second etching segment.

6. The method according to claim 1, wherein at least a duration of the first etching segment is determined statically via preliminary tests or continuously and dynamically, and wherein the device for detecting the polymer breakdown controls the value of the high-frequency AC voltage applied to the semiconductor body or the high-frequency power via the high-voltage generator as a function of time.

7. The method according to claim 1, wherein the device for detecting polymer breakdown dynamically determines and controls a duration of the first etching segment using the occurrence of the polymer breakdown.

8. The method according to claim 1, wherein the change in the ion acceleration voltage applied occurs between the etching segments or the etching steps and passivation steps abruptly or continuously using a ramp function over time.

9. The method according to claim 1, wherein in addition to the ion acceleration voltage applied, at least one of the process pressure, the plasma power, the gas flow rate and the composition of the reactive gas used are also modified between the etching segments or between the etching steps and passivation steps.

10. A method of anisotropic etching of structures in a semiconductor body, including recesses in a silicon body exactly defined laterally by an etching mask, comprising the step of etching the semiconductor body between the plasma and the semiconductor body at least during an etching step, and wherein the etching step is subdivided into at least two etching segments between which the ion acceleration voltage applied is modified each time, wherein the amplitudes of the high-frequency AC voltage applied or of the injected high-frequency power is modulated, clocked, or pulsed using a low-frequency modulation signal from a low-frequency generator, wherein the low-frequency modulation signal is a rectangular signal or a rectangular pulse signal having an adjustable pulse/pause ratio that is different at least between the etching segments, which clocks the amplitude of the injected high-frequency power and which impresses an appropriate pulse/pause ratio between 0.01 and 1 on the applied ion acceleration voltage.

11. The method according to claim 10, wherein the pulse/pause ratio is between 0.01 and 0.2.

12. The method according to claim 10, wherein a gas that is chemically corrosive particularly toward the etching base polymer is added to the plasma during the first etching segment.

13. The method according to claim 10, wherein the semiconductor body is a structured silicon wafer which is connected to a substrate electrode.

14. The method according to claim 10, wherein the etching step is subdivided into a first and a second time segment, and wherein a higher high-frequency AC voltage or a higher high-frequency power is used during the first etching segment than during the second etching segment.

15. The method according to claim 14, wherein a high-frequency AC voltage having an amplitude of greater than 30 V but not greater than 70 V is used during the first etching segment and a high-frequency AC voltage having an amplitude of 10 V to 20 V is used during the second etching segment.

16. The method according to claim 10, wherein at least a duration of the first etching segment is determined statically via preliminary tests or continuously and dynamically, and wherein the device for detecting the polymer breakdown controls the value of the high-frequency AC voltage applied to the semiconductor body or the high-frequency power via the high-voltage generator as a fiction of time.

17. The method according to claim 10, wherein the device for detecting polymer breakdown dynamically determines and controls a duration of the first etching segment using the occurrence of the polymer breakdown.

18. The method according to claim 10, wherein the change in the ion acceleration voltage applied occurs between the etching segments or the etching steps and passivation steps abruptly or continuously using a ramp function over time.

19. The method according to claim 10, wherein in addition to the ion acceleration voltage applied, at least one of the process pressure, the plasma power, the gas flow rate and the composition of the reactive gas used are also modified between the etching segments or between the etching steps and passivation steps.

20. The method according to claim 10, wherein a gas that is chemically corrosive particularly toward the etching base polymer is added to the plasma during the first etching segment.

* * * * *